United States Patent
Kazui et al.

(10) Patent No.: US 9,014,274 B2
(45) Date of Patent: Apr. 21, 2015

(54) VIDEO IMAGE ENCODING DEVICE, VIDEO IMAGE ENCODING METHOD

(71) Applicant: Fujitsu Limited, Kawasaki-shi (JP)

(72) Inventors: Kimihiko Kazui, Kawasaki (JP); Satoshi Shimada, Kawasaki (JP); Junpei Koyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 351 days.

(21) Appl. No.: 13/706,064

(22) Filed: Dec. 5, 2012

(65) Prior Publication Data

US 2013/0188714 A1  Jul. 25, 2013

(30) Foreign Application Priority Data

Jan. 20, 2012  (JP) ................. 2012-010466

(51) Int. Cl.
   *H04N 7/26* (2006.01)
   *H04N 19/176* (2014.01)
   *H04N 19/15* (2014.01)
   *H04N 19/124* (2014.01)
   *H04N 19/91* (2014.01)
   *H03M 7/40* (2006.01)

(52) U.S. Cl.
   CPC ........... *H04N 19/176* (2014.11); *H03M 7/4018* (2013.01); *H04N 19/15* (2014.11); *H04N 19/124* (2014.11); *H04N 19/91* (2014.11)

(58) Field of Classification Search
   CPC .............................. H04N 19/00072
   USPC ...................... 375/240.24, 240.16
   IPC ........................................ H04N 7/26
   See application file for complete search history.

(56) References Cited

U.S. PATENT DOCUMENTS

| | | | |
|---|---|---|---|
| 6,081,554 A * | 6/2000 | Lee et al. ................ | 375/240 |
| 6,628,719 B1 * | 9/2003 | Kono et al. ............. | 375/240.28 |
| 6,795,499 B1 * | 9/2004 | Kato et al. .............. | 375/240.01 |
| 2005/0084168 A1 * | 4/2005 | Fukuhara et al. ........ | 382/240 |

* cited by examiner

FOREIGN PATENT DOCUMENTS

JP  2003-179938  6/2003

OTHER PUBLICATIONS

Joint Collaborative Team on Video Coding (JCTVC-G1103_d9), "High-Efficiency Video Coding (HEVC) text specification Working Draft 5", Joint Collaborative Team on Video Coding of ITU-TSG16 WP3 and ISO/IEC JTC1/SC29/WG11, Nov. 2011.

*Primary Examiner* — Jay Patel
*Assistant Examiner* — Yulin Sun
(74) *Attorney, Agent, or Firm* — Fujitsu Patent Center

(57) ABSTRACT

A video image encoding device includes a calculation unit for calculating a decoding time of each group including plural blocks; a source encode unit for encoding each of the plural blocks based on the encoding amount of each block controlled based on the decoding time and generating compressed data; and an entropy encode unit for performing an arithmetic encoding process on the compressed data in each block and outputting a bit stream. The entropy encode unit outputs undetermined bits retained by the arithmetic encoding process when all bits corresponding to the compressed data in each group are not output at a time point when the arithmetic encoding process on the compressed data in a predetermined number of blocks in a next group is finished, and the calculation unit shifts the decoding time of each group by a processing time of the predetermined number of blocks.

6 Claims, 8 Drawing Sheets

VIDEO IMAGE ENCODING DEVICE, VIDEO IMAGE ENCODING METHOD

CROSS-REFERENCE TO RELATED APPLICATION

This patent application is based upon and claims the benefit of priority of the prior Japanese Patent Application No. 2012-010466 filed on Jan. 20, 2012, the entire contents of which are incorporated herein by reference.

FIELD

The embodiments discussed herein are related to a video image encoding device and a video image encoding method for dividing a picture included in video image data into plural blocks and encoding the blocks.

BACKGROUND

Video image data generally includes a large amount of data. Therefore, devices for handling video image data compress the video image data by encoding the video image data, when transmitting the video image data to another device or when storing the video image data in a storage device.

As a representative standard technology for encoding video images, MPEG (Moving Picture Experts Group phase)-2, MPEG-4, or MPEG-4 AVC/H.264 (H.264 MPEG-4 Advanced Video encoding) developed by the ISO/IEC (International Standardization Organization/International Electrotechnical Commission) is widely used.

As standard encoding technologies described above, there is an inter encoding method for encoding a picture by using information of the picture that is the encoding target and information of pictures before and after the encoding target, and an intra encoding method for encoding a picture by using only information of the picture that is the encoding target.

Generally, the encoding amount of pictures or blocks that have been encoded by the inter encoding method is smaller than the encoding amount of pictures or blocks that have been encoded by the intra encoding method. Therefore, according to the selected encoding mode, the encoding amount of pictures becomes disproportionate within the same sequence. Similarly, according to the selected encoding mode, the encoding amount of blocks becomes disproportionate within the same picture.

Therefore, in order to transmit a data stream including encoded video images by a constant transmission rate even if the encoding amount varies over time, the transmission source device is provided with a transmitting buffer for a data stream, and the transmission destination device is provided with a receiving buffer for a data stream.

A delay caused by these buffers (hereinafter, "buffer delay") is the main factor causing a delay from when each picture is input in the encoding device until each picture is displayed in a decoding device (hereinafter "codec delay"). By reducing the size of the buffer, the buffer delay and the codec delay are reduced. However, as the size of the buffer decreases, the degree in freedom in allocating the encoding amount for each picture decreases. Consequently, the image quality of a reproduced video image is deteriorated. The degree in freedom in allocating the encoding amount means the extent of variation in the encoding amount.

MPEG-2 and MPEG-4 AVC/H.264 respectively specify VBV (Video Buffering Verifier) and CPB (Coded Picture Buffer), which are operations of a receiving buffer in an ideal decoding device.

A video image encoding device controls the encoding amount so that the receiving buffer of an ideal decoding device does not overflow or underflow. An ideal decoding device is specified to perform instantaneous decoding, where the time taken for a decoding process is zero. For example, there is a technology for controlling a video image encoding device relevant to VBV.

The video image encoding device controls the encoding amount to ensure that data of a picture to be decoded is stored in the receiving buffer at the time when the ideal decoding device decodes the picture, so that the receiving buffer of the ideal decoding device does not overflow or underflow.

The receiving buffer underflows when the video image encoding device transmits a stream by a constant transmission rate, and transmission of data used for decoding the picture is not completed until the time when the video image decoding device decodes and displays the pictures, because there is a large encoding amount for each picture. That is to say, the underflow of the receiving buffer means that data used for decoding a picture is not present in the receiving buffer of the decoding device. In this case, it is not possible for the video image decoding device to perform a decoding process, and therefore frame skip occurs.

The video image decoding device performs a decoding process without causing the receiving buffer to underflow, and thus displays a picture after delaying a stream by a predetermined length of time from the receiving time.

As described above, an ideal decoding device is specified so that the decoding process is instantaneously completed by a processing time of zero. Therefore, assuming that the time of inputting an "i" th picture in the video image encoding device is $t(i)$ and the time of decoding the "i" th picture in the ideal decoding device is $dt(i)$, it is possible to display this "i" th picture at the same time as the decoding time, i.e., at $dt(i)$.

For all pictures, the display time period of the picture $\{t(i+1)-t(i)\}$ and $\{dt(i+1)-dt(i)\}$ are equal, and therefore the decoding time $dt(i)$ becomes $\{dt(i)=t(i)+dly\}$, which is delayed by a fixed time dly from the input time $t(i)$. Accordingly, the video image encoding device has to complete transmitting data used for decoding to the receiving buffer of the video image decoding device until the time $dt(i)$.

FIG. 1 illustrates an example of the transition of the buffer occupancy amount of the receiving buffer according to the conventional technology. In the example of FIG. 1, the horizontal axis indicates the time and the vertical axis indicates the buffer occupancy amount of the receiving buffer. A line 300 indicated by a solid line indicates the buffer occupancy amount at each time point.

In the receiving buffer, the buffer occupancy amount is recovered at a predetermined transmission rate, and data used for decoding a picture at the decoding time of each picture is extracted from the buffer. In the example of FIG. 1, data of an "i" th picture starts to be input to the receiving buffer at a time $at(i)$, and the last data of the "i" th picture is input at a time $ft(i)$. The ideal decoding device completes decoding the "i" th picture at a time $dt(i)$, and it is possible to display the "i" th picture at the time $dt(i)$.

The ideal decoding device performs instantaneous decoding, while an actual video image decoding device takes a predetermined length of time to perform a decoding process. Generally, the decoding process time for one picture is shorter than the display period of a picture; however, the actual video image decoding device takes an amount of time close to the display period of a picture for performing the decoding process.

The data of the "i" th picture is input to the receiving buffer from the time $at(i)$ to the time $ft(i)$. However, the time at which data used for decoding each block arrives between at(i) and ft(i) is not ensured. Therefore, the actual video image decoding device starts the process of decoding the "i" th picture from the time ft(i). Accordingly, assuming that the maximum processing time to be taken for decoding one picture is ct, it is only possible to ensure that the actual video image decoding device completes the decoding process within the time ft(i)+ ct.

The video image encoding device ensures that data used for decoding a picture arrives at the receiving buffer until the time dt(i), i.e., it is ensured that ft(i) comes before dt(i). Thus, when ft(i) is at the latest time, ft(i) becomes the same as dt(i).

In this case, the time at which completion of the decoding process is ensured is dt(i)+ct. To display all pictures at equal intervals, the video image decoding device is to delay the display times of the respective pictures by at least a time ct with respect to the ideal decoding device.

In VBV of MPEG-2 and CPB of MPEG-4 AVC/H.264, the difference between the arrival time of each encoded picture in the video image decoding device and the display time of each encoded picture that has been decoded is expressed as (ft(i)−at(i)+ct). That is to say, it is difficult to achieve a codec delay of less than the time ct, where the codec delay extends from when each picture is input to the encoding device to when the picture is output at the decoding device. That is to say, the time ct is usually the processing time for one picture, and therefore it is difficult to achieve a codec delay of less than the processing time for one picture.

In MPEG-4 AVC/H.264 and the arithmetic encoding system of HEVC (High-Efficiency Video encoding) that is undergoing standardization, compressed data of blocks such as a quantization orthogonal transformation coefficient is binarized, and arithmetic encoding is performed for each bin, and the bits are output.

Patent document 1: Japanese Laid-Open Patent Publication No. 2003-179938

Non-patent document 1: JCTVC-G1103, "High-Efficiency Video Coding (HEVC) text specification Working Draft 5", Joint Collaborative Team on Video Coding of ITU-T SG16 WP3 and ISO/IEC JTC1/SC29/WG11, December 2011

In the conventional technology, it is difficult to make a codec delay become the processing time for one picture. However, there is the following method for making the codec delay become less than the processing time for one picture. For example, this method is for assigning each block in a picture to one of a plurality of groups, and assigning a decode start time to each group. A group is, for example, one block line. A block line expresses a line of blocks in the horizontal direction of the picture.

If the amount of information generated in each group is made uniform, the difference in the decode start time of continuous groups matches the processing time for each group, and the time ct becomes the processing time of each group. Thus, as a result, it is possible to decrease the codec delay to the processing time for each group.

In MPEG-4 AVC/H.264, the entropy encoding system is applied as the arithmetic encoding system. In the arithmetic encoding system, after binarizing the compressed data of a predetermined block in a picture that is an encoding target, each bin is processed and a stream is generated. In this case, the delay (hereinafter, "entropy delay") from when entropy encoding is started for the last bin in the target block, to when the encoded bit row is output from the entropy encoding unit as a stream, is generally not zero.

There may be cases where the encoded bit row corresponding to the last bin of the target block is not generated into a stream unless entropy encoding is started for some of the bins of the compressed data of the next block. That is to say, a difference corresponding to the entropy encoding delay is generated between the bit amount transmitted to a transmitting buffer from the start to the end of a process of encoding all blocks in a certain group (generated information amount of pseudo blocks) and the generated information amount of an actual group.

For this reason, even if the encoding device controls the information amount to comply with the decoding time of the group in accordance with the generated information amount of the pseudo group, the time when all bits of the actual group arrive at the receiving buffer is delayed in proportion to the entropy encoding delay.

Accordingly, depending on the extent of the entropy encoding delay, there may be cases where the restriction according to the operation specification of the receiving buffer is not satisfied.

According to the arithmetic encoding system described in MPEG-4 AVC/H.264 and HEVC, compressed data of blocks such as a quantization orthogonal transformation coefficient is binarized, and arithmetic encoding is performed for each bin, and the bits are output. However, the most delayed value from when one bin is input until a corresponding bit is output may be theoretically infinite.

The arithmetic encoding is performed by obtaining a probability interval [0, 1] corresponding to a bin series based on the probability of 0 or 1 for each bin, expressing the interval by bits, and outputting the bits. For example, when the event probability of 0 of each bin is 0.8 for all bins, the probability interval of a bin series (0, 1, 0) is (0.64, 0.75), and the shortest bit expression "11" of this probability interval (after the decimal point) becomes the bit output.

Due to the characteristics of the arithmetic encoding system, when the probability interval crosses 0.5 at a predetermined time point in the bin series, the probability interval is further narrowed down by subsequent bin series, and a state where it is not possible to determine the bit output arises until the probability interval does not cross 0.5 anymore. Occasionally, when the probability interval of the input bin series continuously crosses 0.5, the delay becomes infinite.

In actual situations, when the last block of a picture is encoded, a process of clearing away (outputting) all non-output bits that have been retained (accumulated) in the arithmetic encoder is performed, and therefore the upper limit of delay is the processing time for one picture.

The timing of outputting a bit corresponding to the last bin of the compressed data of the last block in each group is, in the worst case, the time of encoding the last bin in the compressed data of the last block of the picture. Accordingly, the time of starting to decode the first group in the picture coincides with the time of encoding the last bin of the compressed data of the last block in the picture, and therefore the actual codec delay becomes greater than or equal to the processing time for one picture.

As a method of surely and quickly outputting the bits of the last bin of compressed data of the last block in the group, there is a method of inserting a slice header at the boundary between groups, and clearing away (outputting) all non-output bits (undetermined bits) that have been retained in the arithmetic encoder.

However, by inserting a slice header at the boundary between groups, the encoding efficiency is deteriorated, which is particularly undesirable when the bit rate is low.

SUMMARY

According to an aspect of the embodiments, a video image encoding device for dividing each picture included in video image data into a plurality of blocks and performing an encoding process on each of the plurality of blocks, includes a calculation unit configured to calculate a decoding time of each group including the plurality of blocks; an encoding amount control unit configured to control an encoding amount of each of the plurality of blocks based on the decoding time; a source encode unit configured to encode each of the plurality of blocks based on the encoding amount that has been controlled and generate compressed data; and an entropy encode unit configured to perform an arithmetic encoding process on the compressed data in each of the plurality of blocks and output a bit stream, wherein the entropy encode unit outputs undetermined bits retained by the arithmetic encoding process when all bits corresponding to the compressed data in each group are not output at a time point when the arithmetic encoding process on the compressed data in a predetermined number of blocks in a next group is finished, and the calculation unit shifts the decoding time of each group by a processing time of the predetermined number of blocks.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DESCRIPTION OF EMBODIMENTS

Preferred embodiments of the present invention will be explained with reference to accompanying drawings. A video image encoding device described in the embodiments encodes pictures included in video image data in units of blocks, and outputs a bit stream as encoded video image data.

The picture may be a frame or a field. A frame is one still image in the video image data, while a field is a still image obtained by extracting data of odd number rows or data of even number rows from a frame.

Furthermore, the video image that is an encoding target may be a color video image or a monochrome video image.

First Embodiment

Configuration

Figure 1:
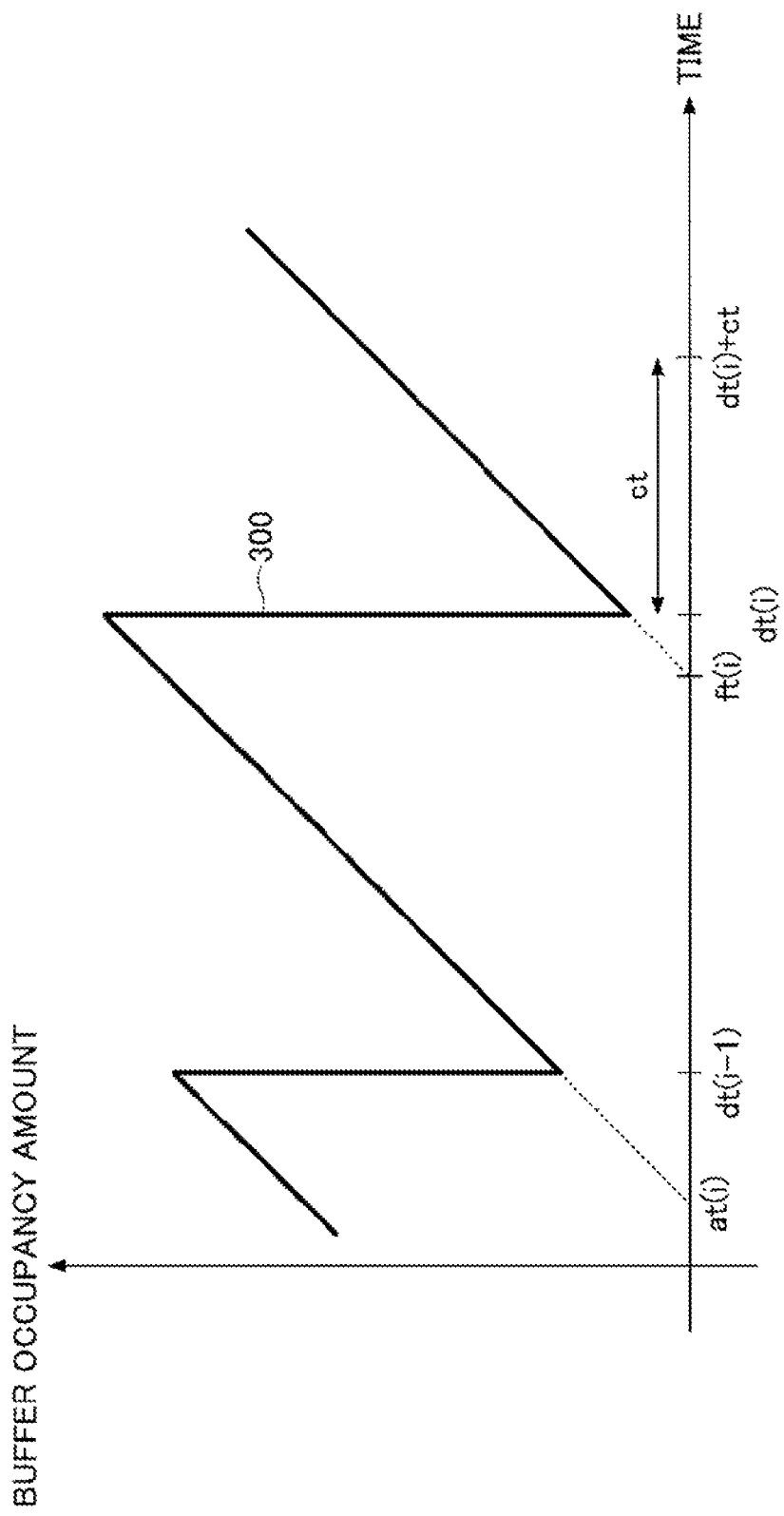
FIG. 1 illustrates an example of the transition of the buffer occupancy amount of a receiving buffer according to the conventional technology.
Figure 2:
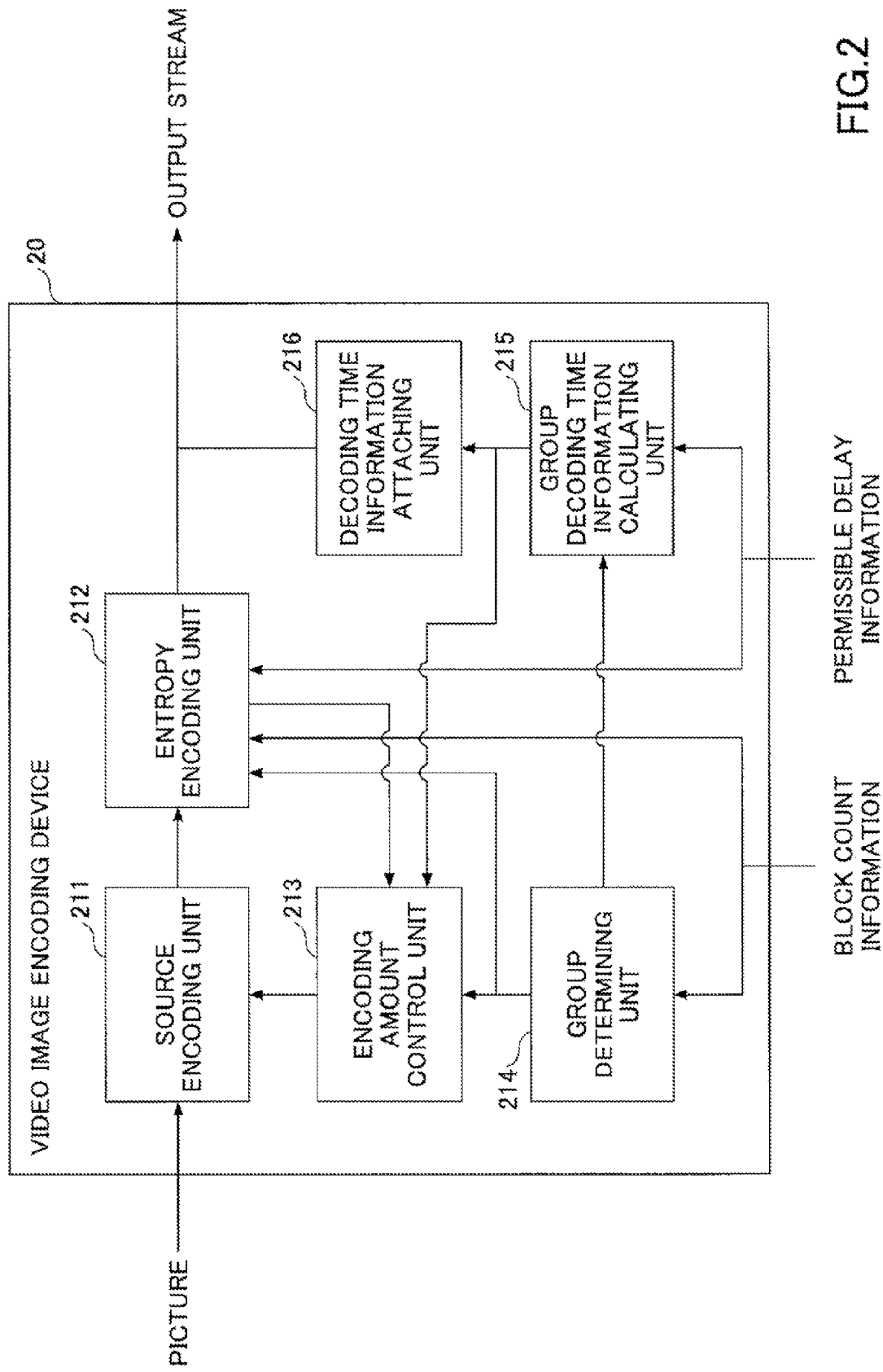
FIG. 2 is a block diagram illustrating an example of a schematic configuration of a video image encoding device according to a first embodiment.

FIG. 2 is a block diagram illustrating an example of a schematic configuration of a video image encoding device according to a first embodiment. In the example of FIG. 2, a video image encoding device 20 includes a source encoding unit 211, an entropy encoding unit 212, an encoding amount control unit 213, a group determining unit 214, a group decoding time information calculating unit 215, and a decoding time information attaching unit 216.

These units included in the video image encoding device 20 may be mounted in the video image encoding device 20 as separate circuits. Furthermore, these units included in the video image encoding device 20 may be mounted in the video image encoding device 20 as a single integrated circuit in which circuits implementing the functions of the respective units are integrated.

The encoding target picture included in the video image data is divided into blocks by a control unit (not illustrated), and each block is input to the source encoding unit 211. Each block includes, for example, 16×16 pixels.

The source encoding unit 211 calculates an intra predicted value or an inter predicted value from a picture that has been locally decoded and stored in a frame memory provided inside or outside the video image encoding device 20. Then, the source encoding unit 211 performs a difference operation on the input block and the calculated value, and calculates a predicted block error.

Next, the source encoding unit 211 performs orthogonal transformation and quantization on the predicted block error. The quantization parameter in a quantization operation is given by the encoding amount control unit 213. The quantized orthogonal transformation coefficient obtained as a result of quantization and the parameter of intra prediction or inter prediction are output to the entropy encoding unit 212 as compressed data of the block. The parameter of intra prediction or inter prediction is, for example, the intra prediction direction and motion vector information.

The source encoding unit 211 performs inverse quantization and inverse orthogonal transformation on the quantized orthogonal transformation coefficient, and calculates the predicted block error on which the quantization error is superimposed. Lastly, the source encoding unit 211 adds the intra predicted value or the inter predicted value to the predicted block error on which the quantization error is superimposed to calculate a locally decoded block, and stores the block in a frame memory.

The entropy encoding unit 212 performs entropy encoding on compressed data by an arithmetic encoding system, based on compressed data output from the source encoding unit 211, group information output from the group determining unit 214, block count information expressing a block number in the picture output from a control unit (not illustrated), and permissible delay information. The entropy encoding unit 212 outputs encoded image data (bit stream) that has undergone arithmetic encoding. In the following, the output bit stream is also referred to as an output stream. The entropy encoding unit 212 is described below with reference to FIG. 3.

The permissible delay information indicates the decoding delay time of each group. The decoding delay time is expressed in units of time per block. The permissible delay information is set so that the delay is small when the bit rate of the encoded video image data is high, and is set so that the delay is large when the bit rate is low.

The group determining unit 214 determines the group to which the block undergoing an encoding process is to belong, according to a predetermined method based on block count information received from a control unit (not illustrated). The block count information expresses the number of each block included in a picture. For example, a number of a block at the top left edge of a picture is set as one, and numbers are sequentially assigned to the blocks in the order of raster scanning. Then, the highest number is assigned to the block on the bottom right edge of the picture. The block count information may include numbers assigned to blocks according to another order.

The group determining unit 214 preferably determines plural groups in a manner that numbers of blocks included in the respective groups are the same as possible, in order to equalize the decoding process time of the groups.

For example, if the group determining unit 214 divides the blocks into groups in units of block lines, it is possible to equalize the number of blocks included in each group in an arbitrary picture size. For example, when the picture size is 1920 pixels×1088 pixels corresponding to a High Definition Television (HDTV), and the block size is 16 pixels×16 pixels and the number of block lines is 68.

Therefore, in this case, each block included in the encoding target picture is classified into one of 68 groups. The number of blocks included in each group may be a value of from one to the total number of blocks in the entire screen.

The group determining unit 214 reports the identification information of the group to which the encoding target block belongs to the encoding amount control unit 213. The group determining unit 214 reports the total number of groups N to the group decoding time information calculating unit 215. The group determining unit 214 may report the index of the block positioned at the beginning of each group to the group decoding time information calculating unit 215.

In the following, a description is given of an example where it is assumed that the number of blocks in the horizontal direction included in the encoding target picture is M, and the number of blocks in the vertical direction is N, and all blocks are equally divided into an N number of groups in units of block lines; however, the present invention is not limited to this example.

The group decoding time information calculating unit 215 assumes that the encoding target picture is the "i" th picture in the encoding order, and calculates a decoding time of the "i" th picture $dt(i)\{=t(i)+dly\}$, which is delayed by a predetermined delay time dly from an input time t(i) of the "i" th picture. The group decoding time information calculating unit 215 calculates a decoding time dgt(i,n) expressing the time when the "n" th group is decoded, based on the calculated decoding time dt(i) of the picture.

The delay time dly is a value obtained by adding the block delay time described in the permissible delay information to a fixed value. Alternatively, instead of calculating dgt(i,n), the group decoding time information calculating unit 215 may calculate {dgt(i,n)−dgt(i,n−1)} that is equal to dgt(i,n), as the decoding time. The group decoding time information calculating unit 215 may obtain the decoding time to be in an appropriate unit, such as a multiple of 1/90000 seconds per unit.

For example, the group decoding time information calculating unit 215 may determine the decoding time of each group by equally dividing the time taken for the decoding process of each picture by the number of groups N, so that the time taken for the decoding process of each group is equal. In this case, the decoding time of the nth (n=1, 2, ..., N) group is calculated according to the following formula (1).

$$dgt(i,n)=dt(i-1)+\{dt(i)-dt(i-1)\}\cdot n/N \qquad \text{Formula (1)}$$

dt(i): decoding time of "i" th picture
dt(i−1): decoding time of "i−1" th picture Furthermore, the time taken for the decoding process is not always equal among the respective groups. Particularly, the group decoding time information calculating unit 215 may only delay the decoding time dgt(i,1) corresponding to the group that is first encoded/decoded, with respect to a decoding time obtained by equally dividing the time taken for the decoding process of once picture, as expressed by the following formula (2).

$$dgt(i,1) \geq dt(i-1)+\{dt(i)-dt(i-1)\}/N \qquad \text{Formula (2)}$$

The group decoding time information calculating unit 215 may determine the decoding time dgt(i,n) (n≥2) of the second group to be encoded/decoded and onward, as expressed by the following formula (3).

$$dgt(i,n)=dgt(i,1)+\{dt(i)-dgt(i,1)\}\cdot(n-1)/(N-1) \qquad \text{Formula (3)}$$

By determining the decoding time as described above, it is possible for the group decoding time information calculating unit 215 to increase the buffer occupancy amount calculated at the encoding amount control unit 213 before the encoding process of the first group starts. As a result, the degree in freedom in controlling the encoding amount increases.

The group decoding time information calculating unit 215 outputs the decoding time information including the decoding time of each group to the encoding amount control unit 213. The group decoding time information calculating unit 215 outputs the decoding time information including the decoding time of each group and the total number of groups N to the decoding time information attaching unit 216.

The encoding amount control unit 213 calculates the estimated value of the buffer occupancy amount of the receiving buffer of the ideal decoding device. R expresses the bit rate of transmission and d expresses the buffer occupancy amount. It is assumed that the entropy encoding process of a block undergoing an encoding process in the entropy encoding unit 212 is completed and the generated encoding amount is b. In this case, b is reported from the entropy encoding unit 212 to the encoding amount control unit 213. The encoding amount control unit 213 subtracts b from d.

The encoding amount control unit 213 recovers the buffer occupancy amount d according to the following formula (4), after the encoding process on the last block of each group is performed.

$$d=d+(dgt(i,n+1)-dgt(i,n))\cdot R$$

The encoding amount control unit 213 calculates a quantization value for each block based on the buffer occupancy amount. At this time, the encoding amount control unit 213 controls the quantization value so that the total generated encoding amount of all blocks included in the group is less than or equal to the buffer occupancy amount immediately before starting the encoding process on the first block of the group, i.e., so that d does not become a negative value during the encoding process.

The encoding amount control unit 213 calculates the quantization value according to a quantization value calculating method of a standard-setting organization reference software in MPEG-2, Test Model 5 (MPEG-2 Test Model 5. April 1993. ISO-IEC/JTC1/SC29/WG11/N0400 (see http://www.mpeg.org/MPEG/MSSG/tm5/)).

Next, the encoding amount control unit 213 compares the buffer occupancy amount d with a predetermined threshold DTH1. When the quantization value becomes the maximum value within the range of possible values, assuming that the maximum encoding amount generated in each block is b0 and the number of blocks that have not undergone the encoding process in the group to which the blocks undergoing the encoding process belong is M0, the threshold DTH1 is expressed by the following formula (5).

$$DTH1 = b0 \cdot M0 + \text{offset}$$

offset: margin term

The encoding amount control unit 213 compares the buffer occupancy amount d with the threshold DTH1, and when d is lower than DTH1, the encoding amount control unit 213 sets the quantization value to be the maximum value.

Furthermore, the maximum encoding amount b0 may be the encoding amount of the block when the frequency coefficients are all zero. At this time, when the buffer occupancy amount d is lower than DTH1, the encoding amount control unit 213 determines the quantization value so that all frequency coefficients of the encoding target block is quantized to become zero.

By performing this control operation by the encoding amount control unit 213, if the average value of encoding amounts of remaining blocks that have not undergone the encoding process in the group does not exceed b0, the virtual decoding receiving buffer does not underflow.

Accordingly, if the encoding amount control unit 213 transmits a bit stream output from the video image encoding device 20 to the video image decoding device according to a predetermined rate R, it is possible to control the encoding amount of the video image data so that the receiving buffer of the video image decoding device does not underflow. The encoding amount control unit 213 reports the obtained quantization value to the source encoding unit 211.

The video image encoding device 20 attaches, to the output stream, at least group information expressing the blocks belonging to each group and decoding time information including the decoding time of the group, in order to share, with the video image decoding device, the group to which the blocks belong and the decoding time of each group. The video image encoding device 20 reports the group information and the decoding time information to the video image decoding device by including the group information and the decoding time information in the output stream.

For example, the decoding time information attaching unit 216 attaches the group information to the header information of the output stream, for each picture or for pictures at every predetermined interval.

The header information is, for example, a Sequence Header specified in MPEG-2 or a Sequence Parameter Set or Supplemental Enhancement Information specified in H.264/AVC. The decoding time for each group may be attached to header information that always accompanies each picture, such as a Picture Header specified in MPEG-2 and a Slice Header specified in H.264.

If the groups are determined in a manner that each group includes the same number of blocks, the video image encoding device 20 reports to the video image decoding device that all blocks have been equally divided into an N number of groups.

Accordingly, the group determining unit 214 reports the number of groups N as group information to the decoding time information attaching unit 216 via the group decoding time information calculating unit 215. The decoding time information attaching unit 216 encodes the received group information.

In MPEG-2 and H.264, encoding is performed in units of blocks of 16 pixels×16 pixels referred to as macroblocks, and this number of blocks does not usually exceed a range that may be expressed by 20 bits. The maximum value of the number of groups N is equal to the maximum value of the number of blocks, and therefore the encoding of N may be done with a fixed bit length.

Furthermore, each group does not always include the same number of blocks. In this case, the group determining unit 214 reports, to the decoding time information attaching unit 216, index information of the first block in each group as group information, together the number of groups N.

The decoding time information attaching unit 216 first encodes the number of groups N, and then sequentially encodes the index information of the first block in each group. For example, the encoding of the index information in the first block is performed by an encoding method of a fixed bit length.

The decoding time information attaching unit 216 may use another encoding method, including a variable length encoding method such as Huffman encoding, to encode the number of groups N and the index information in the first block in each group.

Furthermore, the decoding time for each group is reported from the group decoding time information calculating unit 215 to the decoding time information attaching unit 216. At this time, from the first group to the Nth group that is the last group, the decoding time is expressed in a format of a difference value of, for example, dgt(i,n)−dgt(i,n−1), and is reported from the group decoding time information calculating unit 215 to the decoding time information attaching unit 216.

As to the decoding time of the first group, dgt(i,0) is set in the decoding time dgt(i−1,N){=dt(i−1)} of the last group in the picture immediately before the present picture. The decoding time information attaching unit 216 encodes the decoding time of each group, and adds the encoded decoding time to the data of each picture, and reports this to the video image decoding device.

The decoding time information attaching unit 216 quantizes each difference value by an appropriate precision, for example, by a precision of 1/90000 seconds, and then encodes each difference value by a fixed bit length of approximately 32 bits. Furthermore, in this example, the encoding is done by a fixed bit length; however, the decoding time information attaching unit 216 may use an arbitrary variable-length encoding system to encode the difference value expressing the decoding time of each group.

The video image decoding device calculates the codec delay amount based on the number of groups N included in a bit stream and the decoding time information of each group. When the groups are set in a manner that the groups include the same number of blocks, the codec delay amount becomes ct/N, assuming that the maximum processing time taken for the decoding process of one picture is ct.

Entropy Encoding Unit

Figure 3:
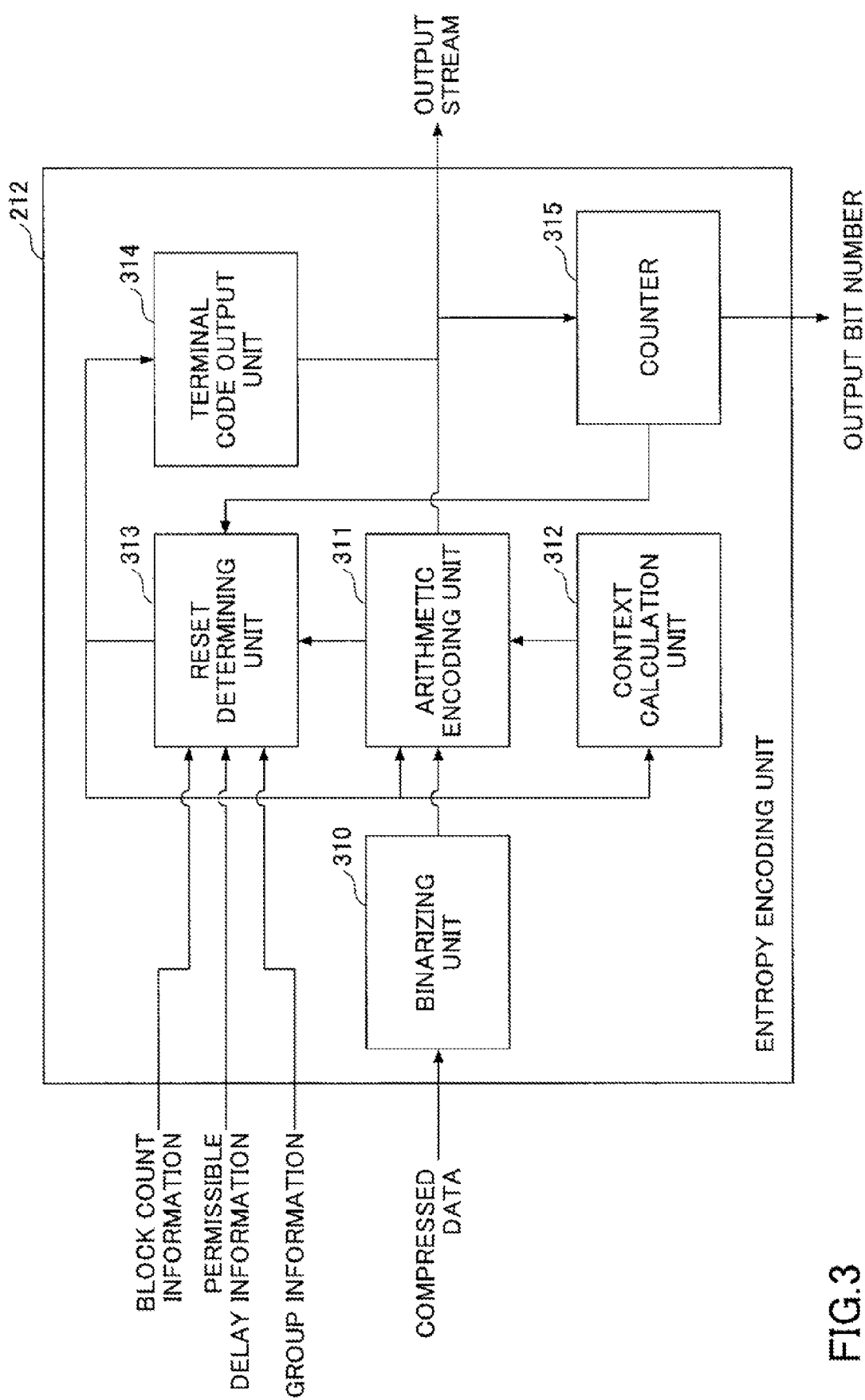
FIG. 3 is a block diagram illustrating an example of a schematic configuration of an entropy encoding unit according to the first embodiment.

Next, a description is given of the entropy encoding unit 212. FIG. 3 is a block diagram illustrating an example of a schematic configuration of the entropy encoding unit 212 according to the first embodiment. In the example of FIG. 3, the entropy encoding unit 212 includes a binarizing unit 310, an arithmetic encoding unit 311, a context calculation unit 312, a reset determining unit 313, a terminal code output unit 314, and a counter 315.

The binarizing unit 310 binarizes the compressed data input from the source encoding unit 211 by a predetermined method. For example, when the macroblock type (mb type) in P_SLICE of MPEG-4 AVC/H.264 is "P_L0_L0_16×8" (inter prediction, two 16×8 motion prediction partitions, both being predictions in the L0 direction), the corresponding bin series is "011".

The context calculation unit 312 assigns a context to each bin in the bin series. The context is uniquely determined according to the type of compressed data, the position in the bin series, and the values of the compressed data of the same type in macroblocks that are vertically or horizontally adjacent to each other. For each context, the MPS (Most Probable Symbol) value of the bin and the probability of the value are assigned. The MPS value and the probability of the value are updated every time a bin is subjected to arithmetic encoding.

The context calculation unit 312 holds and manages the MPS values and probabilities of all contexts. The context calculation unit 312 reports the MPS value and probability of the corresponding context when the arithmetic encoding unit 311 performs arithmetic encoding on the bin. Furthermore, the context calculation unit 312 updates the MPS value and probability of the corresponding context based on the value of the bin on which the arithmetic encoding unit 311 has performed arithmetic encoding. The probability is expressed by the index of [0, 63], instead of actual numbers of [0, 1].

In the above example, the context identifiers (numbers) in the case of mb_type="P_L0_L0_16×8" in P_SLICE of MPEG-4 AVC/H.264 are 14, 15, and 17 in this order starting from the MSB (Most Significant Bit).

The arithmetic encoding unit 311 performs arithmetic encoding on one bin at a time of the bin series output from the binarizing unit 310. The arithmetic encoding unit 311 holds, as internal variables, a bottom limit value Low of a probability interval corresponding to the input bin series, the width of the probability interval Range, and the number of bits that have not been output (non-output bits) "outstandingBits". For example, the number of non-output bits means the number of bits that are retained (accumulated) because the values are undetermined in the arithmetic encoding process. The non-output bits may also be referred to as "undetermined bits".

In the case of CABAC of MPEG-4 AVC/H.264, the probability interval is expressed by an integer of [0, 1023]. The initial values of the internal variables are Low=0, Range=510, outstandingBits=0.

The arithmetic encoding unit 311 acquires the MPS value and probability (index) corresponding to the input bin from the context calculation unit 312, and updates Low and Range by the method of CABAC of MPEG-4 AVC/H.264.

When the probability interval is determined by a specified precision after being updated, the arithmetic encoding unit 311 outputs one or more bits according to the position, and also outputs all non-output bits when outstandingBits is one or more, so that outstandingBits becomes zero.

When the probability interval is not determined by a specified precision after being updated, the arithmetic encoding unit 311 increases the outstandingBits by one according to the probability section. The value of the input bin is output to the context calculation unit 312.

The reset determining unit 313 acquires the value of outstandingBits from the arithmetic encoding unit 311, and acquires, from the counter 315, the number of bits output from the arithmetic encoding unit 311 and the terminal code output unit 314.

Furthermore, the reset determining unit 313 acquires, as control parameters, block count information, permissible delay information, and group information, from a control unit (not illustrated) inside the video image encoding device 20.

The reset determining unit 313 outputs a reset instruction to the arithmetic encoding unit 311, the context calculation unit 312, and the terminal code output unit 314, when it is determined that the entropy encoding unit 212 is to be reset.

A description is given of the operation of resetting the entropy encoding unit 212. As to the arithmetic encoding unit 311, the terminal process of arithmetic encoding (outputting a bit indicating the terminal of a bit row) is executed and the internal variables are initialized.

As to the context calculation unit 312, the MPS values and probability indices of all contexts are initialized. As to the terminal code output unit 314, a byte align bit (bit row of seven bits or less '100 . . . 0') and a next slice header are added.

This slice header indicates only the end of entropy encoding, excluding the end of encoding the last block of a picture, and it is assumed that this slice header does not affect source encoding. A specific example of a slice is the entropy slice described in non-patent document 1.

At the end of encoding the last block of a picture, a regular slice header (and header information of a picture layer according to need) is added.

Other than when encoding is completed for the last block of the picture, the determination of resetting is made when arithmetic encoding is completed for all bins corresponding to compressed data of the Nth block in the group X other than the first group in the picture. The reset determining unit 313 performs resetting when all of the following conditions are satisfied.

(1) There is one or more outstandingBits when arithmetic encoding is completed for all bins corresponding to compressed data of all blocks in a group (X−1) immediately before group X.

(2) Zero bits are output by the arithmetic encoding unit 311, when arithmetic encoding is completed for all bins corresponding to all compressed data of the first block to the Nth block in group X.

When these conditions are satisfied, it means that none of the bits corresponding to the compressed data of that group are output at the time point when arithmetic encoding is completed for the compressed data of N blocks in the next group.

In order for the video image encoding device 20 to determine the decoding start time of the last bit in each group, the upper limit of delay (in units of bins) from when the last bin of each group is input to the arithmetic encoding unit 311 until the corresponding bit is output from the arithmetic encoding unit 311 is to be restricted.

In the case of CABAC of MPEG-4 AVC/H.264, the outstandingBits may infinitely continue to increase depending on the input bin series. A simple way to solve this problem is to insert a slice boundary after arithmetic encoding is completed for the bin series of each group; however, this deteriorates the encoding efficiency.

The first embodiment makes use of the fact that outstandingBits is unlikely to increase to a significantly high value (several tens of bits). A slice boundary is inserted only when the outstandingBits do not return to zero even after a predetermined time period passes after completing arithmetic encoding on the bin series in each group, to prevent the encoding efficiency from deteriorating. Incidentally, "outstandingBits return to zero" means that the values are determined for all bits having undetermined values and the bits are output.

For example, in the first embodiment, the predetermined time period is the period (processing time) of N (predetermined number of) blocks ("N block period"). The arithmetic encoding unit 311 performs arithmetic encoding on 2N bins or more in the case of MPEG-4 AVC/H.264 during the N block period, and therefore it is expected that outstandingBits return to zero by a high probability.

Furthermore, the upper limit of delay of the reset determining unit 313 is ensured to be the N block period as described above, and therefore the decoding start time of each group is delayed by the N block period. The N block period is the time taken to process N blocks. That is to say, the group decoding time information calculating unit 215 shifts the decoding time of each group by the N block period.

The group decoding time information calculating unit 215 reports the decoding time that has been shifted by the N block period to the decoding time information attaching unit 216, and causes the decoding time information attaching unit 216 to attach the decoding time to the output stream.

The terminal code output unit 314 adds the byte align bit and the next slice header to the output stream, in accordance with the reset instruction from the reset determining unit 313.

The counter 315 counts the number of bits output from the arithmetic encoding unit 311 and the terminal code output unit 314. The count value is output to the reset determining unit 313 and the encoding amount control unit 213.

Operation

Figure 4:
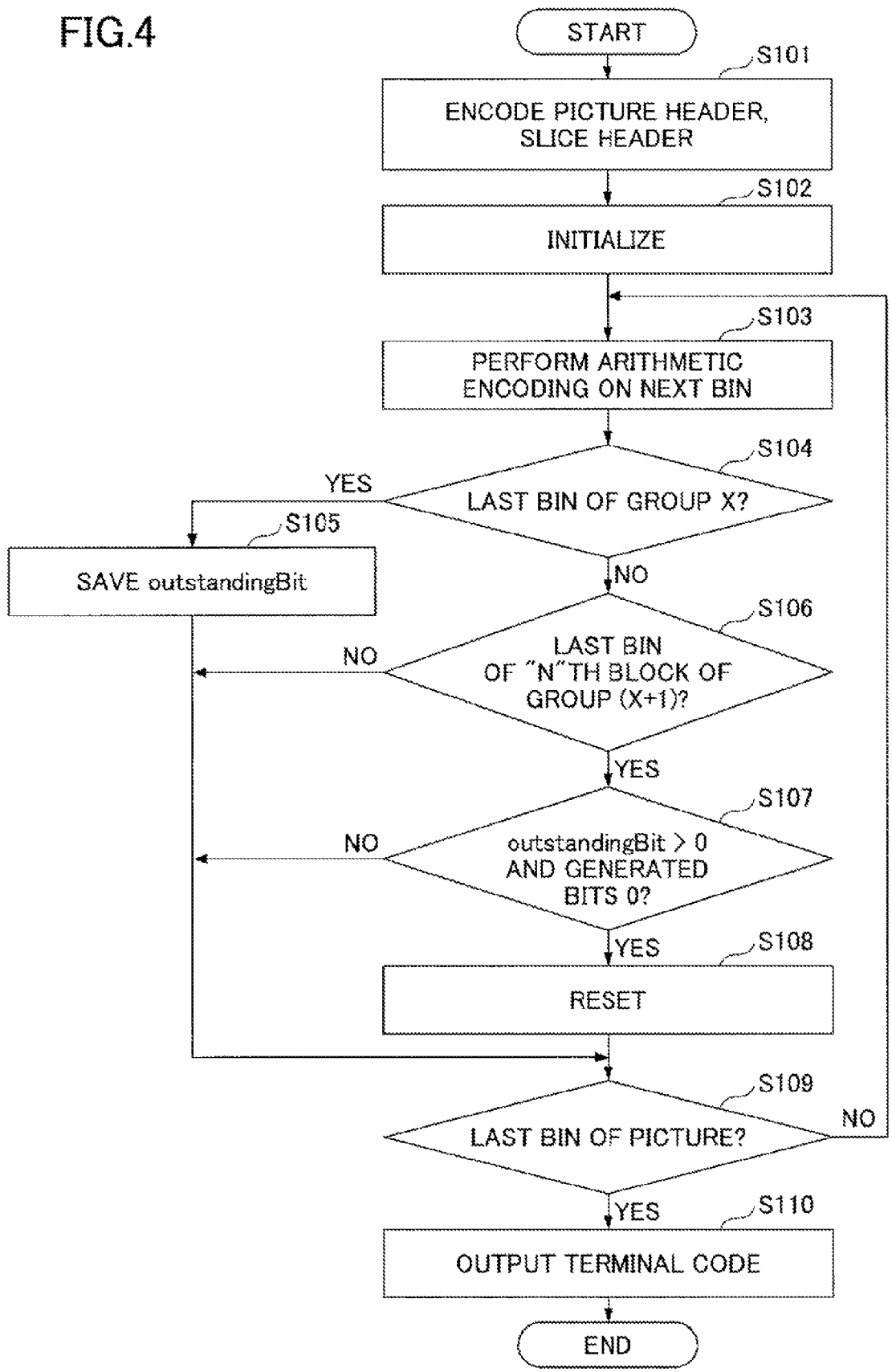
FIG. 4 is a flowchart of an example of an entropy encoding process according to the first embodiment.

A description is given of the operation of the video image encoding device 20 according to the first embodiment. FIG. 4 is a flowchart of an example of an entropy encoding process according to the first embodiment. The process of FIG. 4 is performed by the entropy encoding unit 212 on one picture.

In step S101, the terminal code output unit 314 encodes the picture header and slice header when starting to perform entropy encoding on a picture. At this time, the arithmetic encoding unit 311 is not used. The terminal code output unit 314 generates a picture header and slice header by a method other than arithmetic encoding, and adds the headers to the bit stream to be output.

In step S102, the entropy encoding unit 212 initializes the respective units.

In step S103, the binarizing unit 310 sequentially binarizes the compressed data of the respective blocks in the picture. Next, the arithmetic encoding unit 311 sequentially performs arithmetic encoding on each bin, starting from the first bin of the bin series.

In step S104, the arithmetic encoding unit 311 determines whether the bin that has been arithmetically encoded is the last bin in group X (excluding last group in picture). When the bin is the last bin in group X (YES in step S104), the process proceeds to step S105, and when the bin is not the last bin in group X (NO in step S104), the process proceeds to step S106.

In step S105, the reset determining unit 313 saves the variable outstandingBits inside the arithmetic encoding unit 311 after encoding the bin.

In step S106, the reset determining unit 313 determines whether the bin that has undergone arithmetic encoding is the last bin in the Nth block in the group (X+1) (excluding first group in picture). When the bin is the last bin in the Nth block (YES in step S106), the process proceeds to step S107, and when the bin is not the last bin (NO in step S106), the process proceeds to step S109.

In step S107, the reset determining unit 313 determines whether the number of bits output from the arithmetic encoding unit 311 is zero, when the number of outstandingBits saved in step S105 is one or more and the first block to the Nth block in the group (X+1) have undergone arithmetic encoding. When these conditions are satisfied (YES in step S107), the process proceeds to step S108, and when these conditions are not satisfied (NO in step S107), the process proceeds to step S109.

In step S108, the reset determining unit 313 instructs a reset by inserting an entropy slice immediately after the Nth block from the top in group (X+1). Specifically, each unit performs a terminal process of arithmetic encoding, byte-aligning of a bit stream, initialization of arithmetic encoding, and insertion of an entropy slice header.

Furthermore, the group decoding time information calculating unit 215 delays the decoding time of each group by the N block period.

In step S109, the arithmetic encoding unit 311 determines whether the bin that has undergone arithmetic encoding is the last bin in the compressed data of all blocks in the picture. When the bin is the last bin in the compressed data of all blocks (YES in step S109), the process proceeds to step S110, and when the bin is not the last bin in the compressed data of all blocks (NO in step S109), the process returns to step S103, and arithmetic encoding is performed on the next bin.

In step S110, the terminal code output unit 314 outputs a terminal code, and the process is ended.

As described above, according to the first embodiment, when arithmetic encoding is performed, it is possible to realize a codec delay of less than a processing time for one picture, while preventing the encoding efficiency from deteriorating. Furthermore, according to the first embodiment, it is possible to prevent the receiving buffer of the video image decoding device from underflowing due to a delay by entropy encoding.

Second Embodiment

Next, a description is given of a video image encoding device according to a second embodiment. In the second embodiment, a slice boundary is not inserted, but the bin on which arithmetic encoding is performed is adaptively-changed to output undetermined bits.

Configuration

The configuration of the video image encoding device according to the second embodiment is similar to that of the video image encoding device 20 according to the first embodiment, and therefore the same reference numerals are used. However, in the video image encoding device according to the second embodiment, the entropy encoding unit 212 is different from that of the first embodiment, and therefore the following describes the entropy encoding unit 212 according to the second embodiment.

Entropy Encoding Unit

Figure 5:
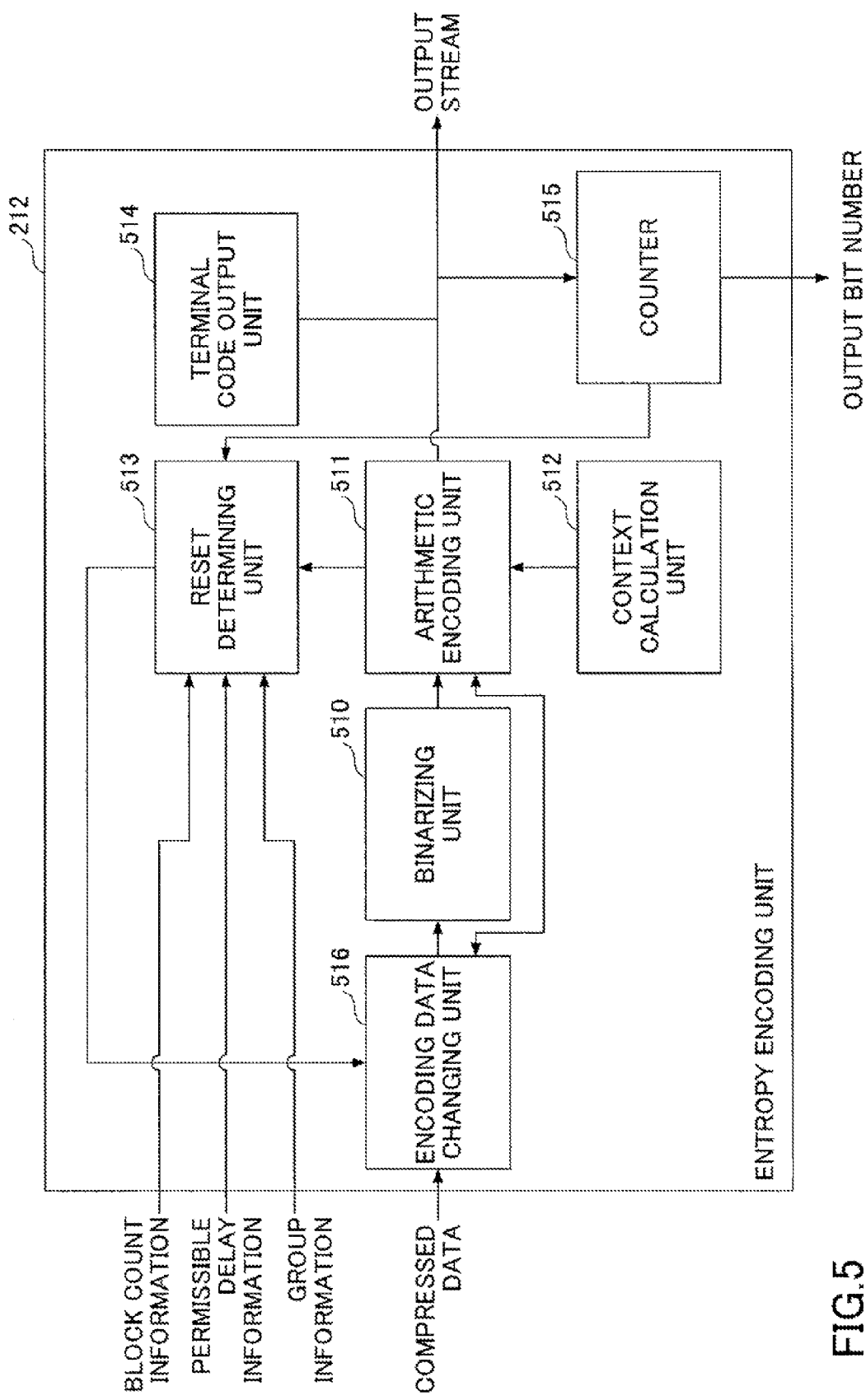
FIG. 5 is a block diagram illustrating an example of a schematic configuration of an entropy encoding unit according to a second embodiment.

FIG. 5 is a block diagram illustrating an example of a schematic configuration of the entropy encoding unit 212 according to the second embodiment. In the example of FIG. 5, the entropy encoding unit 212 includes a binarizing unit 510, an arithmetic encoding unit 511, a context calculation unit 512, a reset determining unit 513, a terminal code output unit 514, a counter 515, and an encoding data changing unit 516.

The binarizing unit 510 and the counter 515 respectively perform the same process as the binarizing unit 310 and the counter 315 of FIG. 3, and are thus not further described.

The reset determining unit 513 performs a reset process when all of the following conditions are satisfied.

(1) There is one or more outstandingBits when arithmetic encoding is completed for all bins corresponding to compressed data of all blocks in a group (X−1) immediately before group X.

(2) Zero bits are output by the arithmetic encoding unit 511, when arithmetic encoding is completed for all bins corresponding to all compressed data of the first block to the (N−1)th block in group X.

Furthermore, at the time of the reset process, the reset determining unit 513 instructs a control unit (not illustrated) inside the video image encoding device 20 to set the encoding mode for the Nth block starting from the first block in group X, to inter prediction encoding. Furthermore, the reset determining unit 513 reports reset information to the encoding data changing unit 516.

As described above, in the second embodiment, a slice boundary is not inserted, but the bin on which arithmetic encoding is performed is adaptively-changed to output undetermined bits. This method is described in detail below.

In the method of non-patent document 1, a method of improving the encoding efficiency of the moving vector in the inter prediction encoding block is applied. This method includes the procedures of acquiring plural motion vectors (hereinafter, "motion vector prediction value candidates") from a block that has been encoded that is adjacent to the block being processed, and selecting a motion vector prediction value candidate that is optimum as a prediction value of a motion vector of the block being processed.

A bit stream includes motion vector prediction value index information indicating which motion vector has been selected, and the difference between the selected motion vector prediction value and the motion vector of the block being processed.

In the following, as a matter of simplification, the number of motion vector prediction value candidates is two. In this case, the bin of the motion vector prediction value index information is zero or one. The same applies when the number of motion vector prediction value candidates is three or more.

Arithmetic encoding has a characteristic in that when there are one or more outstandingBits and one bin is encoded, the value of an undetermined bit is surely determined by a bin value of either zero or one. In the second embodiment, this characteristic is used.

The encoding data changing unit 516 temporarily holds a data row that is input. When reset information is reported from the reset determining unit 513, the encoding data changing unit 516 sends, to the binarizing unit 510, the data up to the motion vector prediction value index information in the inter encoding compressed data in the Nth block in group X.

The encoding data changing unit 516 instructs the arithmetic encoding unit 511 to perform virtual arithmetic encoding on a bin corresponding to the motion vector prediction value index information that has been input.

The arithmetic encoding unit 511 reports whether the outstandingBits have been reset to zero according to the input bin. When the outstandingBits have been reset to zero, the encoding data changing unit 516 performs arithmetic encoding on the input data without modifying the data.

When the outstandingBits have not been reset to zero, the encoding data changing unit 516 determines a value of the motion vector prediction value index information (0 or 1), and performs arithmetic encoding on the inverted value (1 or 0).

Next, the encoding data changing unit 516 acquires, from the source encoding unit 211, a motion vector MV of the block being processed and a motion vector prediction value PMV corresponding to the inverted value. The encoding data changing unit 516 sets (MV-PMV) as the motion vector prediction error to be encoded.

Accordingly, in the decoding process, the motion vector of the block N is properly decoded, and therefore the reproduced image is unaffected by the change in the motion vector prediction value index information.

In addition to the operations of the arithmetic encoding unit 311 according to the first embodiment, the arithmetic encoding unit 511 performs virtual arithmetic encoding on the input bin. Virtual arithmetic encoding is only for outputting whether the outstandingBits become zero when arithmetic encoding is performed on the input bin, and the actual arithmetic encoding is not performed.

The context calculation unit 512 and the terminal code output unit 514 are different from the context calculation unit 312 and the terminal code output unit 314 according to the first embodiment, and do not receive the reset determination result of the reset determining unit 513. Only at the time of entropy encoding reset at the end of the picture, a reset process is performed.

That is to say, the entropy encoding unit 212 according to the second embodiment determines whether there is one or more bits retained because the value is undetermined in the arithmetic encoding, and whether there is zero bits output by performing arithmetic encoding on the compressed data of N-1 blocks of the next group, at the time point when arithmetic encoding has been completed for the compressed data in the respective groups.

When the above conditions are satisfied, and when it is determined that the compressed data of the Nth block is to be changed for outputting undetermined bits, the entropy encoding unit 212 changes the compressed data in a manner that the decoding result is unaffected by the change, and performs entropy encoding.

A case where the compressed data is to be changed is, for example, when the outstandingBits is not zero as a result of virtual arithmetic encoding. Changing the compressed data without affecting the decoding result means, for example, when the value of the motion vector prediction value index information is inverted, the motion vector prediction value indicated by the inverted value is used.

Operation

Figure 6:
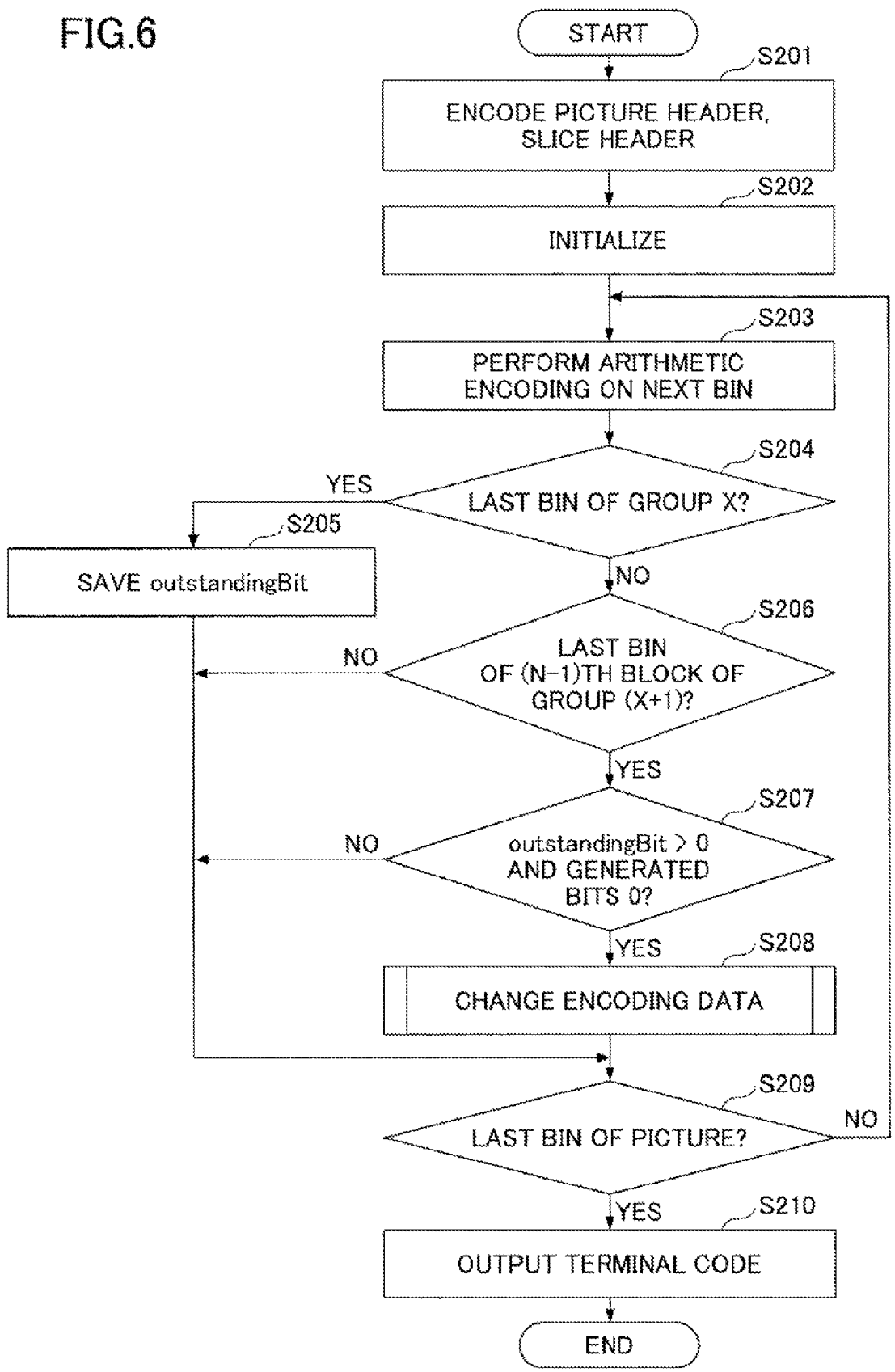
FIG. 6 is a flowchart of an example of an entropy encoding process according to the second embodiment.

Next, a description is given of the video image encoding device according to the second embodiment. FIG. 6 is a flowchart of an example of an entropy encoding process according to the second embodiment. The process of FIG. 6 is performed by the entropy encoding unit 212 on one picture.

In step S201, the terminal code output unit 514 encodes the picture header and slice header when starting to perform entropy encoding on a picture. At this time, the arithmetic encoding unit 511 is not used. The terminal code output unit 514 generates a picture header and slice header by a method other than arithmetic encoding, and adds the headers to the bit stream to be output.

In step S202, the entropy encoding unit 212 initializes the respective units.

In step S203, the binarizing unit 510 sequentially binarizes the compressed data of the respective blocks in the picture. Next, the arithmetic encoding unit 511 sequentially performs arithmetic encoding on each bin, starting from the first bin of the bin series.

In step S204, the arithmetic encoding unit 511 determines whether the bin that has been arithmetically encoded is the last bin in group X (excluding last group in picture). When the bin is the last bin in group X (YES in step S204), the process proceeds to step S205, and when the bin is not the last bin in group X (NO in step S204), the process proceeds to step S206.

In step S205, the reset determining unit 513 saves the variable outstandingBits inside the arithmetic encoding unit 511 after encoding the bin.

In step S206, the reset determining unit 513 determines whether the bin that has undergone arithmetic encoding is the last bin in the Nth block in the group (X+1) (excluding first group in picture). When the bin is the last bin in the Nth block (YES in step S206), the process proceeds to step S207, and when the bin is not the last bin (NO in step S206), the process proceeds to step S209.

In step S207, the reset determining unit 513 determines whether the number of bits output from the arithmetic encoding unit 511 is zero, when the number of outstandingBits saved in step S205 is one or more and the first block to the (N-1)th block in the group (X+1) have undergone arithmetic encoding. When these conditions are satisfied (YES in step S207), the process proceeds to step S208, and when these conditions are not satisfied (NO in step S207), the process proceeds to step S209.

In step S208, the reset determining unit 513 instructs to change the encoding data of the Nth block from the top in group (X+1). The process of changing the encoding data is described below with reference to FIG. 7.

Furthermore, when the process of changing the encoding data is performed, the group decoding time information calculating unit 215 delays the decoding time of each group by the N block period.

In step S209, the arithmetic encoding unit 511 determines whether the bin that has undergone arithmetic encoding is the last bin in the compressed data of all blocks in the picture. When the bin is the last bin in the compressed data of all blocks (YES in step S209), the process proceeds to step s210, and when the bin is not the last bin in the compressed data of all blocks (NO in step S209), the process returns to step s203, and arithmetic encoding is performed on the next bin.

In step S210, the terminal code output unit 514 outputs a terminal code, and the process is ended.

Figure 7:
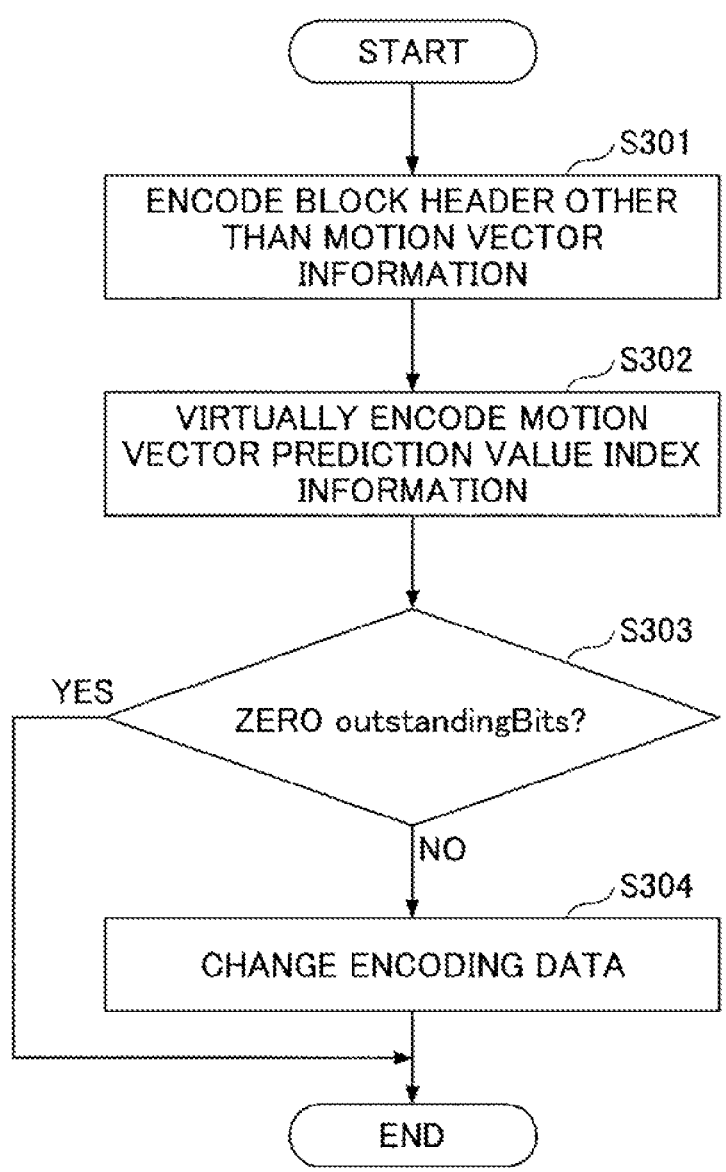
FIG. 7 is a flowchart of an example of an encoding data changing process according to the second embodiment.

FIG. 7 is a flowchart of an example of an encoding data changing process according to the second embodiment. In step S301 of FIG. 7, the binarizing unit 510 binarizes the block header other than the motion vector of the block N. The arithmetic encoding unit 511 performs arithmetic encoding on the binarized data.

In step S302, the encoding data changing unit 516 instructs the arithmetic encoding unit 511 to perform virtual arithmetic encoding on the motion vector prediction value index information. The arithmetic encoding unit 511 performs virtual arithmetic encoding on the motion vector prediction value index information.

In step S303, the encoding data changing unit 516 determines whether the outstandingBits are zero as a result of the virtual arithmetic encoding at the arithmetic encoding unit 511. When the outstandingBits are zero (YES in step S303), the process is ended, and when the outstandingBits are not zero (NO in step S303), the process proceeds to step S304.

In step S304, the encoding data changing unit 516 changes the encoding data of the motion vector prediction. For example, the encoding data changing unit 516 inverts the bits of the motion vector prediction value index information, and sets the difference between the motion vector prediction value corresponding to the inverted bits and the motion vector of the block N as new motion vector prediction error data.

As described above, according to the second embodiment, when arithmetic encoding is performed, it is possible to realize a codec delay of less than a processing time for one picture, while preventing the encoding efficiency from deteriorating. Furthermore, according to the second embodiment, even if slice borders are not inserted, it is possible to clear away undetermined bits.

Third Embodiment

Figure 8:
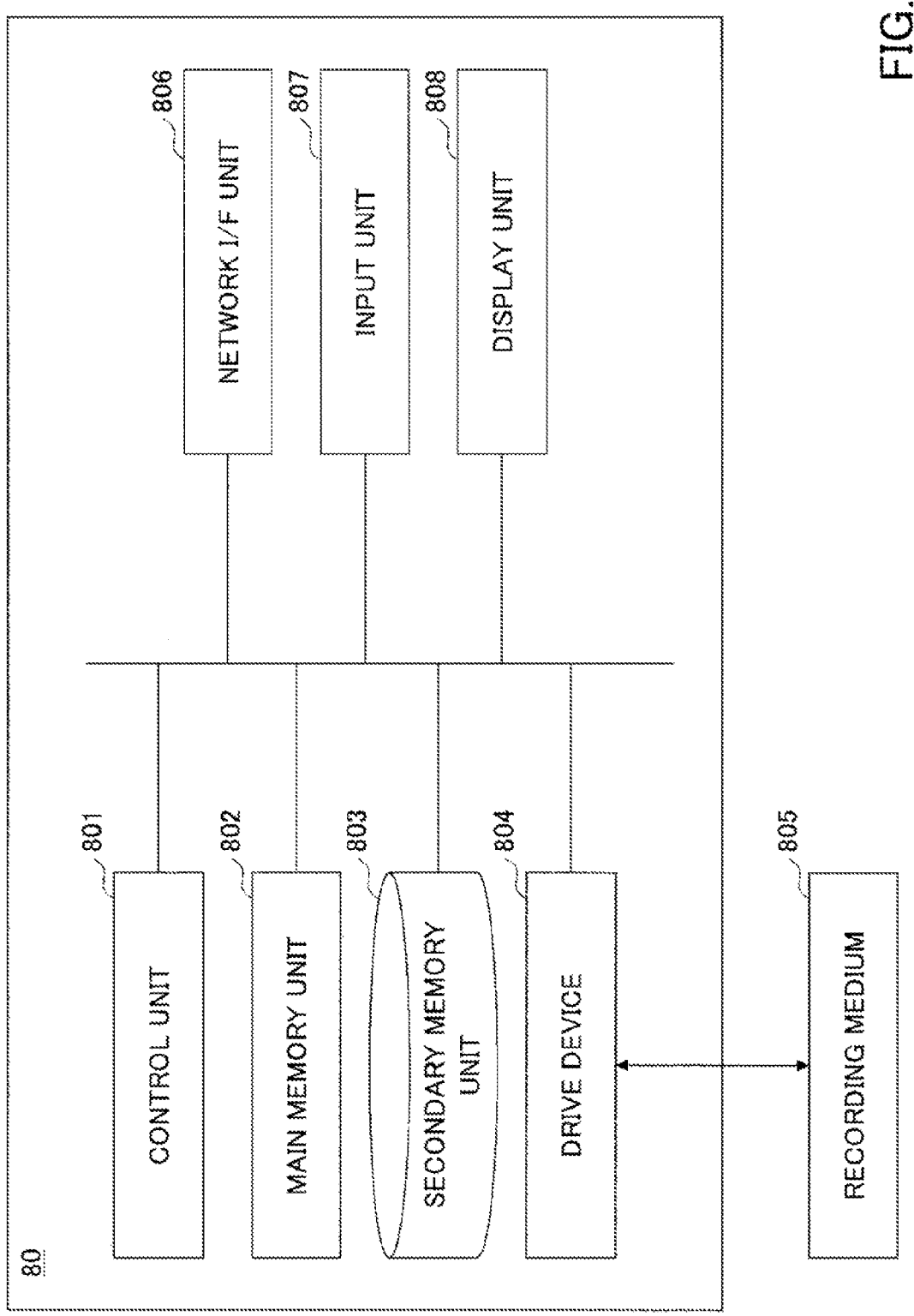
FIG. 8 is a block diagram of an example of a video image processing device according to a third embodiment.

FIG. 8 is a block diagram of an example of a video image processing device according to a third embodiment. A video image processing device 80 is an example of the video image encoding devices described in the respective embodiments. As illustrated in FIG. 8, the video image processing device 80 includes a control unit 801, a main memory unit 802, a secondary memory unit 803, a drive device 804, a network I/F unit 806, an input unit 807, and a display unit 808. These units are connected via a bus so that it is possible to exchange data among each other.

The control unit 801 controls the respective devices and performs calculation and processing on data in the computer. Furthermore, the control unit 801 is a processor for executing programs stored in the main memory unit 802 and secondary memory unit 803, receiving data from the input unit 807 and the storage device, performing calculations and processing on the data, and outputting the data to the display unit 808 and the storage device.

The main memory unit 802 is, for example, a ROM (Read-Only Memory) or a RAM (Random Access Memory), and is a storage device for storing or temporarily saving the OS that is the basic software and programs such as application software executed by the control unit 801, and data.

The secondary memory unit 803 is, for example, a HDD (Hard Disk Drive), which is a storage device for storing data relevant to application software.

The drive device 804 is for reading a program from a recording medium 805 such as a flexible disk, and installing the program in the storage device.

The recording medium 805 stores a predetermined program. The program stored in the recording medium 805 is installed in the video image processing device 80 via the drive device 804. The installed predetermined program may be executed by the video image processing device 80.

The network I/F unit 806 is an interface between the video image processing device 80 and peripheral devices having communication functions connected via a network such as a LAN (Local Area Network) and a WAN (Wide Area Network) constructed by a wired and/or wireless data transmission path.

The input unit 807 includes a curser key, a keyboard including keys for inputting numbers and various functions, and a mouse and a slice pad for selecting a key on the display screen of the display unit 808. Furthermore, the input unit 807 is a user interface used by the user for giving operation instructions to the control unit 801 and inputting data.

The display unit 808 includes a LCD (Liquid Crystal Display), and displays information according to display data input from the control unit 801. The display unit 808 may be provided outside, in which case the video image processing device 80 has a display control unit.

Accordingly, the video image encoding process described in the above embodiments may be implemented as a program to be executed by a computer. By installing this program from a server and causing a computer to execute this program, it is possible to implement the above-described video image encoding process.

Furthermore, the video image encoding program may be recorded in the recording medium 805, and cause a computer or a mobile terminal to read the recording medium 805 recording this program to implement the above-described video image encoding process.

The recording medium 805 may be various types of recording media such as a recording medium for optically, electrically, or magnetically recording information, for example, a CD-ROM, a flexible disk, and a magnet-optical disk, or a semiconductor memory for electrically recording information, for example, a ROM and a flash memory. The recording medium 805 does not include carrier waves.

A program executed by the video image processing device 80 has a module configuration including the respective units described in the above embodiments. As the actual hardware, the control unit 801 reads a program from the secondary memory unit 803 and executes the program to load one or more of the above described units in the main memory unit 802, so that one or more the units are generated in the main memory unit 802.

Furthermore, the video image encoding process described in the above embodiments may be mounted in one or more integrated circuits.

The video image encoding device according to the above embodiments may be used for various purposes. For example, the video image encoding device may be built in a video camera, an image transmitting device, an image receiving device, a television telephone system, a computer, or a mobile phone.

According to an aspect of the embodiments, when arithmetic encoding is performed, it is possible to realize a codec delay of less than a processing time for one picture, while preventing the encoding efficiency from deteriorating.

The present invention is not limited to the specific embodiments described herein, and variations and modifications may be made without departing from the scope of the present invention. Furthermore, all or some of the elements constituting the above embodiments may be combined.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A video image encoding device for dividing each picture included in video image data into a plurality of blocks and performing an encoding process on each of the plurality of blocks, the video image encoding device comprising:
    a calculation unit configured to calculate a decoding time of each group including the plurality of blocks;
    an encoding amount control unit configured to control an encoding amount of each of the plurality of blocks based on the decoding time;
    a source encode unit configured to encode each of the plurality of blocks based on the encoding amount that has been controlled and generate compressed data; and
    an entropy encode unit configured to perform an arithmetic encoding process on the compressed data in each of the plurality of blocks and output a bit stream, wherein
    the entropy encode unit outputs undetermined bits retained by the arithmetic encoding process when all bits corresponding to the compressed data in each group are not output at a time point when the arithmetic encoding process on the compressed data in a predetermined number of blocks in a next group is finished, and
    the calculation unit shifts the decoding time of each group by a processing time of the predetermined number of blocks.

2. The video image encoding device according to claim 1, wherein
    the entropy encode unit is configured to insert a slice header and reset the arithmetic encoding process, when a number of the undetermined bits retained in the arithmetic encoding process is one or more and a number of bits output by the arithmetic encoding process on the compressed data of an N number of blocks in the next group is zero, at a time point when the arithmetic encoding process on the compressed data in each group is finished.

3. The video image encoding device according to claim 1, wherein
    the entropy encode unit is configured to change the compressed data in a manner that a decoding result is unaffected by the change and perform entropy encoding, when the entropy encode unit determines that the compressed data of an Nth block is to be changed in order to output undetermined bits, when a number of the undetermined bits retained in the arithmetic encoding process is one or more and a number of bits output by the arithmetic encoding process on the compressed data of an N-1 number of blocks in the next group is zero, at a time point when the arithmetic encoding process on the compressed data in each group is finished.

4. The video image encoding device according to claim 1, wherein
    the entropy encode unit is configured to perform a virtual arithmetic encoding process on bins corresponding to index information of a motion vector predicted value, and when the entropy encode unit determines that a number of the undetermined bits retained is one or more,
    the entropy encode unit is configured to invert the index information, and perform entropy encoding using a motion vector predicted value indicated by the inverted index information.

5. A method for encoding a video image performed by a video image encoding device for dividing each picture included in video image data into a plurality of blocks and performing an encoding process on each of the plurality of blocks, the method comprising:
    calculating a decoding time of each group including the plurality of blocks;
    controlling an encoding amount of each of the plurality of blocks based on the decoding time;
    encoding each of the plurality of blocks based on the encoding amount that has been controlled and generating compressed data; and
    performing an arithmetic encoding process on the compressed data in each of the plurality of blocks and outputting a bit stream, wherein
    the outputting of the bit stream includes outputting undetermined bits retained by the arithmetic encoding process when all bits corresponding to the compressed data in each group are not output at a time point when the arithmetic encoding process on the compressed data in a predetermined number of blocks in a next group is finished, and
    the calculating of the decoding time includes shifting the decoding time of each group by a processing time of the predetermined number of blocks.

6. A non-transitory computer-readable recording medium storing a video image encoding program for causing a video image encoding device for dividing each picture included in video image data into a plurality of blocks and performing an encoding process on each of the plurality of blocks, to execute a method comprising:
    calculating a decoding time of each group including the plurality of blocks;
    controlling an encoding amount of each of the plurality of blocks based on the decoding time;

encoding each of the plurality of blocks based on the encoding amount that has been controlled and generating compressed data; and performing an arithmetic encoding process on the compressed data in each of the plurality of blocks and outputting a bit stream, wherein the outputting of the bit stream includes outputting undetermined bits retained by the arithmetic encoding process when all bits corresponding to the compressed data in each group are not output at a time point when the arithmetic encoding process on the compressed data in a predetermined number of blocks in a next group is finished, and the calculating of the decoding time includes shifting the decoding time of each group by a processing time of the predetermined number of blocks.

\* \* \* \* \*